(12) United States Patent  (10) Patent No.: US 8,466,524 B2
Zheng et al.  (45) Date of Patent: Jun. 18, 2013

(54) STATIC MAGNETIC FIELD ASSISTED RESISTIVE SENSE ELEMENT

(75) Inventors: Yuankai Zheng, Fremont, CA (US); Xiaohua Lou, Milpitas, CA (US); Haiwen Xi, San Jose, CA (US); Michael Xuefei Tang, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 174 days.

(21) Appl. No.: 13/040,155

(22) Filed: Mar. 3, 2011

(65) Prior Publication Data

US 2011/0149641 A1    Jun. 23, 2011

Related U.S. Application Data

(63) Continuation of application No. 12/501,902, filed on Jul. 13, 2009, now Pat. No. 7,999,337.

(51) Int. Cl.
*H01L 29/82* (2006.01)
*G11C 11/02* (2006.01)

(52) U.S. Cl.
USPC .... 257/421; 257/422; 257/427; 257/E29.323; 438/3; 365/157; 365/173; 360/324.2

(58) Field of Classification Search
USPC ........ 257/20, 414, 421–427, E29.323; 438/3; 365/157–158, 171–173; 360/324–326, 313
See application file for complete search history.

(56) References Cited

U.S. PATENT DOCUMENTS

| | | | |
|---|---|---|---|
| 6,714,444 B2 | 3/2004 | Huai et al. | |
| 6,819,586 B1 | 11/2004 | Anthony et al. | |
| 6,980,469 B2 | 12/2005 | Kent et al. | |
| 7,126,202 B2 | 10/2006 | Huai et al. | |
| 7,170,778 B2 | 1/2007 | Kent et al. | |
| 7,180,770 B2 | 2/2007 | Perner et al. | |
| 7,241,631 B2 | 7/2007 | Huai et al. | |
| 7,242,045 B2 | 7/2007 | Nguyen et al. | |
| 7,245,462 B2 | 7/2007 | Huai et al. | |
| 7,372,116 B2 | 5/2008 | Fullerton et al. | |
| 7,486,552 B2 | 2/2009 | Apalkov et al. | |
| 2003/0143431 A1* | 7/2003 | Hasegawa | 428/692 |
| 2005/0104146 A1 | 5/2005 | Nickel et al. | |
| 2005/0213375 A1 | 9/2005 | Perner et al. | |

(Continued)

OTHER PUBLICATIONS

L Berger, "Emission of spin waves by a magnetic multilayer traversed by a current," Physical Review B, Oct. 1, 1996, pp. 9353-9358, vol. 54, No. 13, The American Physical Society.

(Continued)

*Primary Examiner* — Jami M Valentine
(74) *Attorney, Agent, or Firm* — Hall Estill Attorneys at Law

(57) ABSTRACT

Apparatus and associated method for writing data to a non-volatile memory cell, such as spin-torque transfer random access memory (STRAM). In accordance with some embodiments, a resistive sense element (RSE) has a heat assist region, magnetic tunneling junction (MTJ), and pinned region. When a first logical state is written to the MTJ with a spin polarized current, the pinned and heat assist regions each have a substantially zero net magnetic moment. When a second logical state is written to the MTJ with a static magnetic field, the pinned region has a substantially zero net magnetic moment and the heat assist region has a non-zero net magnetic moment.

20 Claims, 6 Drawing Sheets

U.S. PATENT DOCUMENTS

| | | | |
|---|---|---|---|
| 2006/0255383 A1* | 11/2006 | Kaiser et al. | 257/295 |
| 2007/0165449 A1 | 7/2007 | Zheng et al. | |
| 2008/0112094 A1 | 5/2008 | Kent et al. | |
| 2008/0291720 A1 | 11/2008 | Wang et al. | |
| 2008/0291721 A1* | 11/2008 | Apalkov et al. | 365/173 |

OTHER PUBLICATIONS

T. Seki, S. Mitani, K. Yakushiji and K. Takanashi, "Spin-polarized current-induced magnetization reversal in perpendicularly magnetized L10-FePt layers," Applied Physics Letters 88, 2006, pp. 1-3, American Institute of Physics.

J. C. Slonczewski, "Current-driven excitation of magnetic multilayers," Journal of Magnetism and Magnetic Materials 159, 1996, pp. L1-L7, Elsevier Science B. V.

J. Z. Sun, "Spin-current interaction with a monodomain magnetic body: A model study," Physical Review B, Jul. 1, 2000, pp. 570-578, vol. 62, No. 1, The American Physical Society.

* cited by examiner

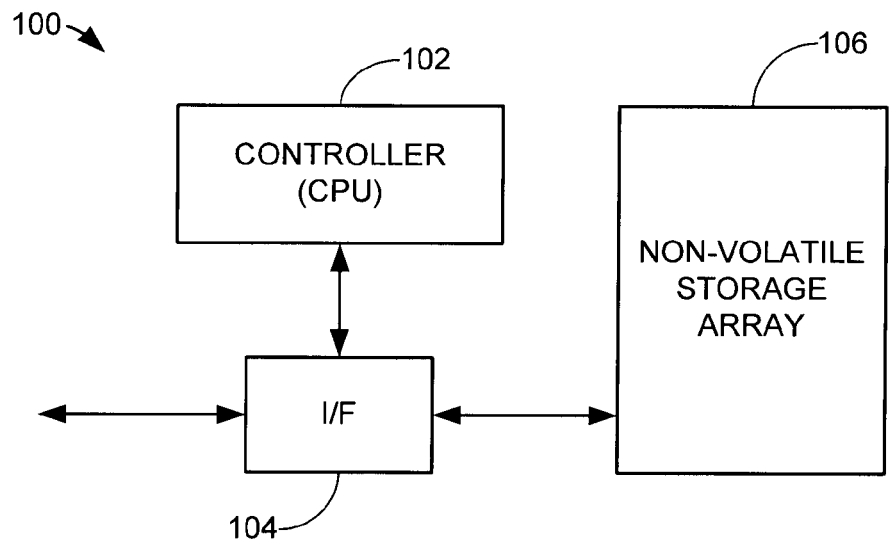
FIG. 1
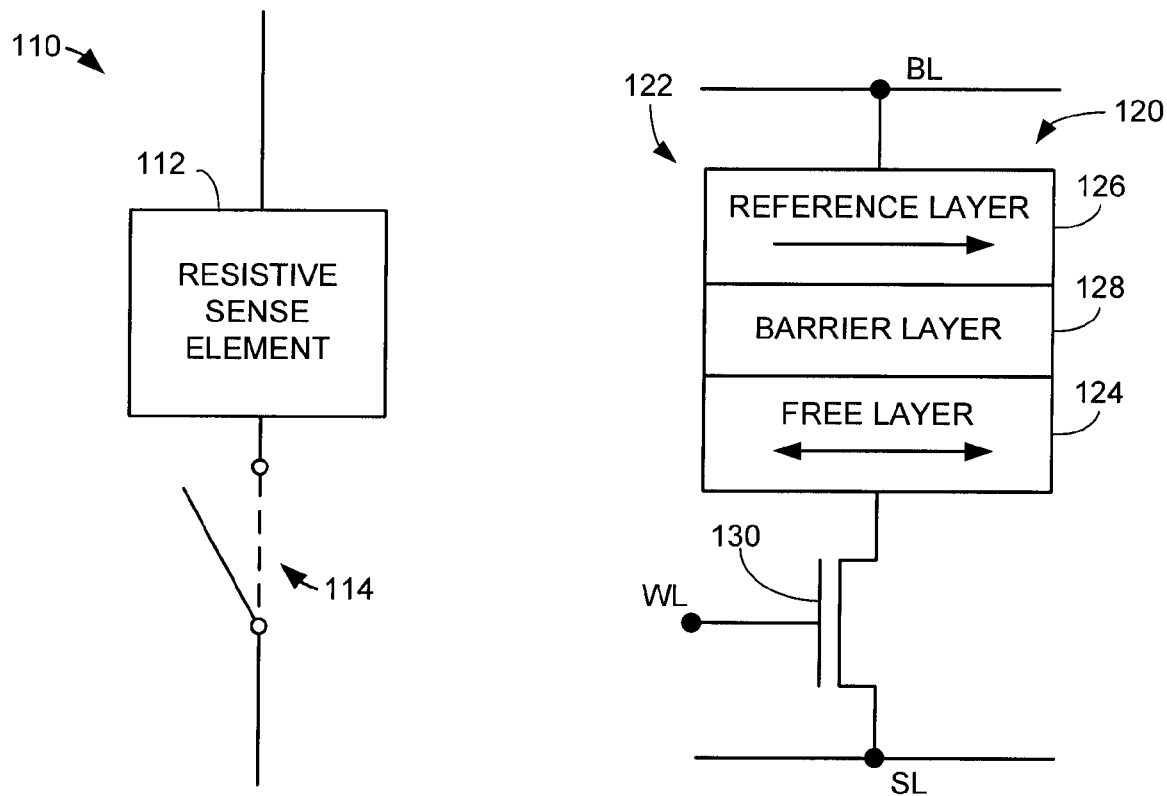
FIG. 2
FIG. 3

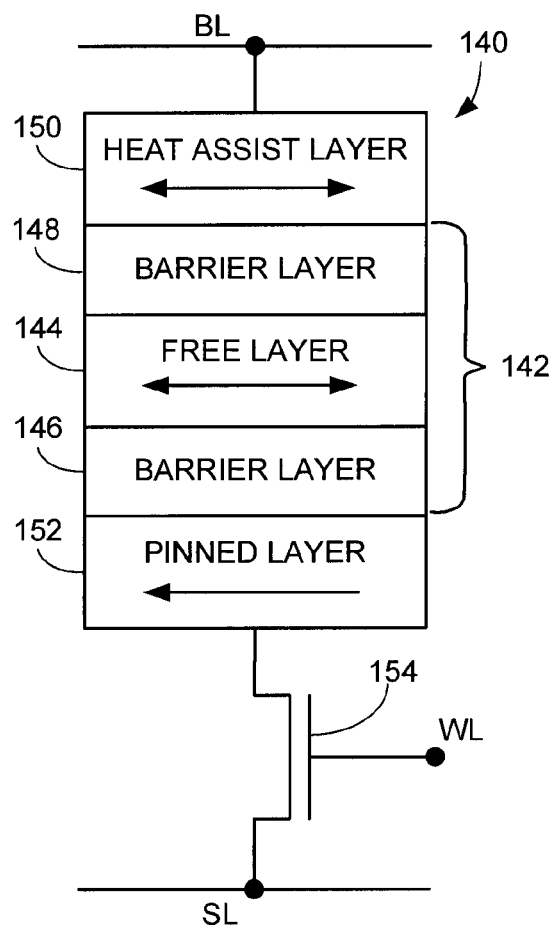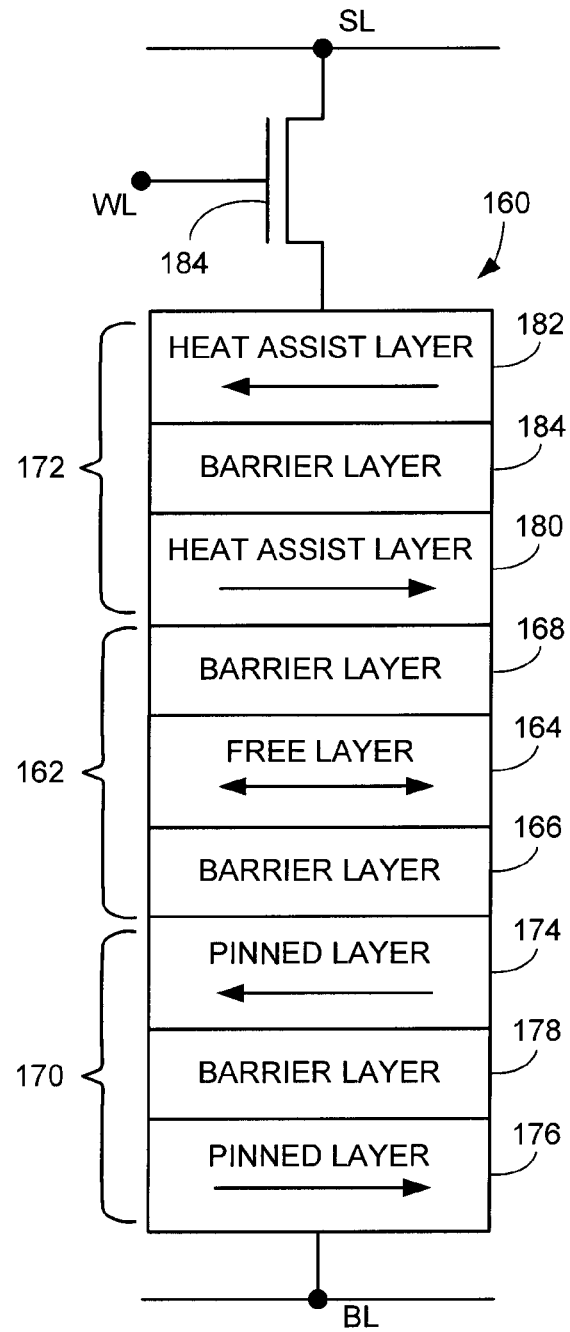
FIG. 4
FIG. 5

STATIC MAGNETIC FIELD ASSISTED RESISTIVE SENSE ELEMENT

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

Resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), and spin-torque transfer random access memory (STTRAM or STRAM).

In these and other types of devices, it is often desirable to increase performance while decreasing power consumption, lowering switching currents and decreasing design complexity.

SUMMARY

Various embodiments of the present invention are generally directed to an apparatus and associated method for writing data to a non-volatile memory cell, such as spin-torque transfer random access memory (STRAM).

In accordance with some embodiments, a resistive sense element (RSE) has a heat assist region, magnetic tunneling junction (MTJ), and pinned region. When a first logical state is written to the MTJ with a spin polarized current, the pinned and heat assist regions each have a substantially zero net magnetic moment. When a second logical state is written to the MTJ with a static magnetic field, the pinned region has a substantially zero net magnetic moment and the heat assist region has a non-zero net magnetic moment.

In accordance with other embodiments, a resistive sense element (RSE) having a heat assist region, magnetic tunneling junction (MTJ), and pinned region is provided. A first logical state is then written to the MTJ with a spin polarized current while the pinned and heat assist regions each have a zero net magnetic moment. A second logical state is then written to the MTJ with a static magnetic field while the pinned region has a zero net magnetic moment and the heat assist region is activated to produce a non-zero net magnetic moment.

These and various other features and advantages which characterize the various embodiments of the present invention can be understood in view of the following detailed discussion in view of the accompanying drawings.

BRIEF DESCRIPTION OF THE DRAWINGS

FIG. 1 generally illustrates a functional block representation of a data storage device.

FIG. 2 generally illustrates a functional block representation of a unit cell.

FIG. 3 generally illustrates a structure of the memory cell of FIG. 2 constructed and operated in accordance with various embodiments of the present invention.

FIG. 4 displays an exemplary resistive sense element constructed and operated in accordance with various embodiments of the present invention.

FIG. 5 shows an exemplary resistive sense element constructed and operated in accordance with various embodiments of the present invention.

DETAILED DESCRIPTION

Figure 6:
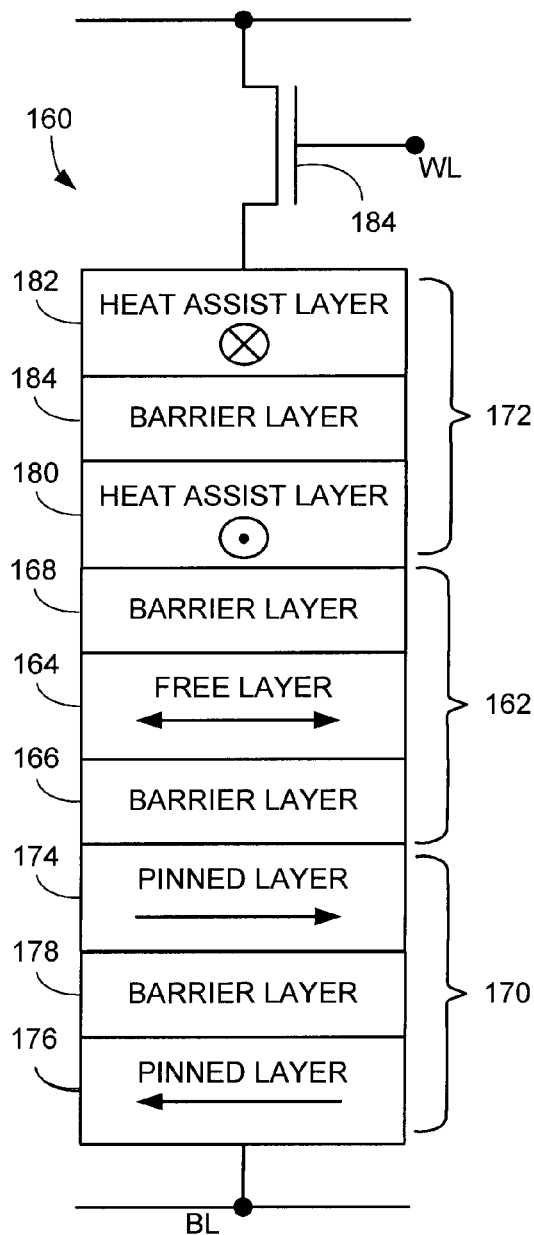
FIG. 6 illustrates an alternative exemplary resistive sense element constructed and operated in accordance with various embodiments of the present invention.

FIG. 1 provides a functional block representation of a data storage device 100 constructed and operated in accordance with various embodiments of the present invention. The device 100 includes a top level controller (CPU) 102, an interface (I/F) circuit 104 and a non-volatile data storage array 106. The I/F circuit 104 operates under the direction of the controller 102 to transfer data between the array 106 and a host device.

FIG. 2 displays functional block representations of a unit cell 110 construction that can be used in the array 106 of FIG. 1. The unit cell 110 has a resistive sense element (RSE) 112 connected in series with a switching device 114. The switching device 114 functions to increase the resistance of the unit cell 110 when in an open position, as shown, so as to effectively prevent current from passing through the cell. A closed position allows read and write currents through the unit cell 110.

FIG. 3 shows an exemplary RSE construction at 120. The RSE 120 is configured as a spin torque-transfer random access memory (STRAM) cell that includes a magnetic tunneling junction (MTJ) 122 formed from two ferromagnetic layers 124, 126 separated by a barrier layer 128 (such as magnesium oxide, MgO). The resistance of the MTJ 122 is determined in relation to the relative magnetization directions of the ferromagnetic layers 124, 126: when the magnetization is in the same direction (parallel), the MTJ is in the low resistance state ($R_L$); when the magnetization is in opposite directions (anti-parallel), the MTJ is in the high resistance state ($R_H$).

The magnetization direction of the reference layer 126 is fixed by coupling the reference layer to a pinned magnetization layer (e.g., a permanent magnet, etc.). The magnetization direction of the free layer 124 can be changed by passing a driving current polarized by magnetization in the reference layer 126.

To read the logic state stored by the MTJ 122, a relatively small current is passed through the MTJ between a source line (SL) and a bit line (BL). Because of the difference between the low and high resistances of the MTJ in the respective logical 0 and 1 states, the voltage at the bit line will be different, which can be sensed using a suitable sense amplifier. A switching device 130 allows selective access to the MTJ 122 during read and write operations. The switching device 130 can be characterized as a metal oxide semiconductor field effect transistor (MOSFET). A word line (WL) is connected to a gate terminal of the transistor 130, as shown.

While operable, unit cells such as represented in FIGS. 2-3 can have disadvantages, such as asymmetric write current characteristics. For example, a greater write driver effort may be required to set the RSE 120 in FIG. 3 to the anti-parallel high resistance state (hard programming direction) than to set the RSE to the parallel low resistance state (easy programming direction). The relative ordering of the RSE and the switching device within the unit cell with respect to the direction of write current flow can also contribute to such asymmetric write characteristics.

Accordingly, various embodiments of the present invention are generally directed to a novel memory cell structure with improved write characteristics. As explained below, the memory cell structure includes a resistive sense element (RSE) having a heat assist region, a magnetic tunneling junction (MTJ), and a pinned region. The pinned and heat assist regions each have a substantially zero net magnetic moment while a first logical state is written to the MTJ with a spin polarized current.

Further, the pinned region has a substantially zero net magnetic moment and the heat assist region has a non-zero net magnetic moment when a second logical state is written to the MTJ with a static magnetic field. Both logical states are written with unipolar write currents that pass in the same direction through the memory cell.

FIG. 4 provides an exemplary construction for an RSE 140 capable of being used in the unit cell 110 of FIG. 2 in accordance with various embodiments. The RSE 140 is characterized by a magnetic tunneling junction 142 that comprises a free layer 144 as well as a first and second barrier layer 146 and 148. In some embodiments, the free layer 144 is a ferromagnetic material capable of maintaining a magnetic polarity, and the first and second barrier layers 146, 148 are oxide barrier layers. The first and second oxide layers 146 and 148 can be constructed of various materials and are not limited to oxides. That is, a barrier material other than an oxide can be utilized in the magnetic tunneling junction 142 to shield the free layer 144 from unwanted magnetic pulses.

Further, the magnetic tunneling junction 142 of the RSE 140 is disposed between a heat assist layer 150 and a pinned layer 152. The heat assist layer 150 has the capability of storing a magnetic polarity with a moment in either of two opposing directions. Meanwhile, the pinned layer 152 has a magnetic polarity with a moment in a single direction. In some embodiments, the magnetic moment of the pinned layer 152 opposes the magnetic moment of the heat assist layer 150 in order to provide a net zero magnetic moment on the magnetic tunneling junction 142.

In addition, a switching device 154 is also connected to the RSE 140 to allow selection of the RSE 140, as desired. It can be appreciated that the position of the switching device in relation to the RSE 140 is not limiting and can vary without deterring from the spirit of the present invention.

It should be noted that the heat assist layer 150 has a zero net magnetic moment, in some embodiments, at a first temperature while having a non-zero net magnetic moment at an elevated second temperature. As shown in FIG. 4, the heat assist layer 150 can be a single ferromagnetic material such as, but not limited to, rare earth-transition metals and their alloys such as TbCoFe. However, multiple heat assist layers 150 can be used in combination to form a heat assist region, illustrated in FIG. 5.

FIG. 5 shows an exemplary construction for an RSE 160 in accordance with the various embodiments of the present invention. A magnetic tunneling junction 162 with a free layer 164 as well as a first and second oxide layer 166 and 168 is shown disposed between a pinned region 170 and a heat assist region 172. The pinned region 170 comprises a first and second pinned layer 174 and 176 connected by an oxide layer 178. The pinned layers 176 and 178 are configured to have opposing magnetic moments in order to provide a zero net magnetic moment to the magnetic tunneling junction 162.

However, the use of an oxide material to separate the pinned layers 176 and 178 is not required as any desired spacing material can be used without deterring from the spirit of the present invention. Likewise, the specific magnetic orientation of the first and second pinned layers 176 and 178 is not limited and can be any variety of configurations that produce a zero net magnetic moment. One skilled in the art can appreciate that the position of a switching device 184 is adjacent to the heat assist region 172, but can be located adjacent the pinned region 170 without detrimental effect to the spirit of the present invention.

As discussed above, the heat assist region 172 comprises multiple heat assist layers 180 and 182 configured to provide a zero net magnetic moment to the magnetic tunneling junction 162 at a first temperature. Much like the pinned region 170, the heat assist layers 180 and 182 have magnetic orientations that produce opposing magnetic moments. A barrier, oxide, or similar layer 184 is disposed between the heat assist layers 180 and 182 to separate the magnetic moments.

As such, the RSE 160 has a zero net magnetic moment due to the balancing magnetic moments of both the pinned layers 176 and 174 as well as the heat assist layers 180 and 182. Once the free layer 164 holds a magnetic polarity, a resistance state of the RSE 160 will be present and allow a logical state to be read. It should be noted that the multiple heat assist layers can be constructed with synthetic ferri-magnetic material to which one layer has a Curie temperature that is higher than the other heat assist layer. Hence, at a predetermined temperature, the magnetic moments of the heat assist layers 180 and 182 as well as the heat assist region 172 can be manipulated with temperature, as desired.

Figure 7:
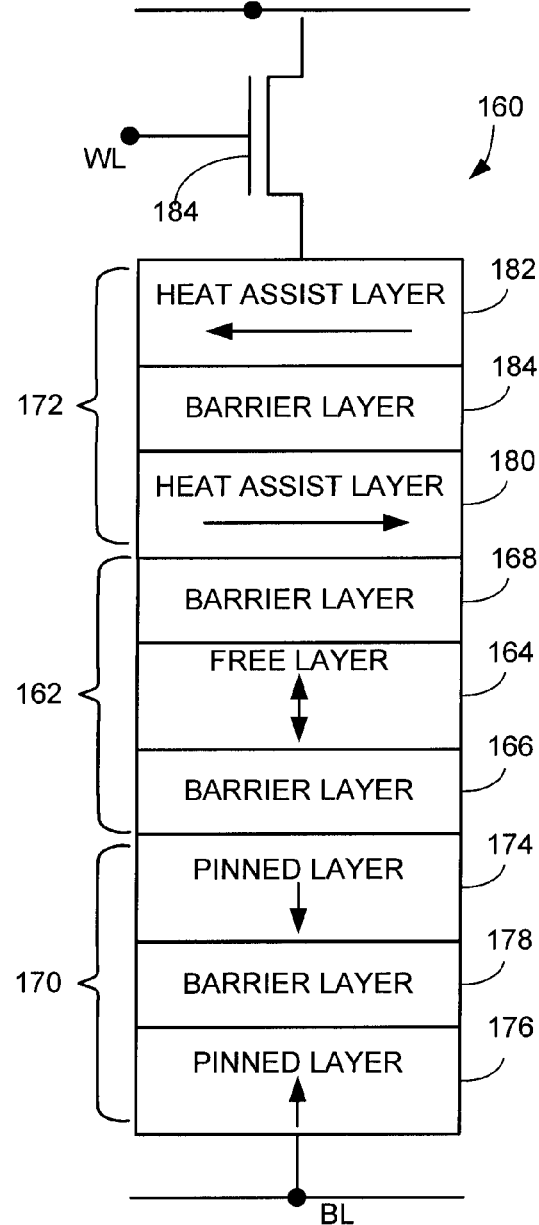
FIG. 7 displays an alternative exemplary resistive sense element constructed and operated in accordance with various embodiments of the present invention.

In FIGS. 6 and 7, the RSE 160 of FIG. 5 is generally illustrated in alternative constructions that conform to various embodiments of the present invention. As shown in FIG. 6, the magnetic moment of each of the heat assist layers 180 and 182 as well as the heat assist region 172 is perpendicular with the magnetic moment of the magnetic tunneling junction 162 and pinned region 170. This configuration still provides a zero net magnetic moment to the magnetic tunneling junction at a first temperature while greatly reducing the amount of current required to write a logical state to the free layer 164 at a second temperature.

In contrast, the magnetic tunneling junction 162 and pinned region 170 can be configured to have perpendicular anisotropy in relation to the heat assist region 172, as illustrated in FIG. 7. Despite a perpendicular anisotropy, the net magnetic moment experienced by the magnetic tunneling junction 162 remains zero until a second temperature activates the heat assist region 172 to produce a non-zero net magnetic moment.

It should be noted that the magnetic orientations of each of the regions of the RSE 160 depicted in FIGS. 6 and 7 are not limiting. For example, the magnetic tunneling junction 162 can be configured to have perpendicular anisotropy while the pinned region 170 has a magnetic moment perpendicular to the heat assist region 172 that has in-plane magnetization.

One issue that has been found with STRAM cells (as well as with other types of RSE cells) relates to the minimal achievable sizing of the cell transistor. Generally, it is desirable to ensure that the cell transistor is configured to be large enough to be able to accommodate the requisite write current densities and gate control voltages necessary to carry out write operations without incurring damage to the cell transistor. At the same time, since the transistor can often be the limiting factor in cell scalability, reducing the size of the transistor can promote increases in the overall density of the memory array.

A related matter is write current asymmetry. STRAM cells are often configured such that write currents are passed in different directions through the cell in order to write the different logical states. This can also be true for other types of RSE cells. For example, application of a write current in a first direction may set the resistance of the cell low, thereby signifying a first logical state (e.g., logical 0). Application of a write current in the opposite second direction may set the resistance of the cell high, thereby signifying the opposite logical state (e.g., logical 1).

Depending on the configuration of the cell, it may be harder to write the cell in one direction as compared to the other. A number of factors can contribute to such asymmetry. One factor relates to the relative ordering of the magnetic tunneling junction and switching device elements with respect to the direction of the applied write current; that is, whether the write current passes through the magnetic tunneling junction first, or passes through the switching device first. Other factors can relate to the configuration and ordering of layers within the magnetic tunneling junction (or other variable resistive element).

For the exemplary RSE 160 of FIG. 5, it is contemplated that it will be relatively easy to write the state of the magnetic tunneling junction 162 when the current is passed in a direction such that the write current encounters the magnetic tunneling junction 162 prior to the switching device 184 (this direction is referred to as the "easy" direction). Contrawise, it is contemplated that it will be more difficult to write in the opposite direction when the write current passes through the transistor (drain-source juncture) prior to encountering the magnetic tunneling junction (this direction is referred to as the "hard" direction).

Accordingly, as explained below, various embodiments of the present invention utilize a novel structure and technique to facilitate the writing of various logical states to an RSE with a uni-directional and uni-polar current and a static magnetic field. The use of a single current, polarity, and direction for a RSE allows for complete avoidance of both RSE and unit cell write current asymmetry. Meanwhile, the use of a static magnetic field to write a logical state to the RSE provides advantageous power consumption in combination with improved reliability of data storage due to increased unit cell degradation.

Figure 8:
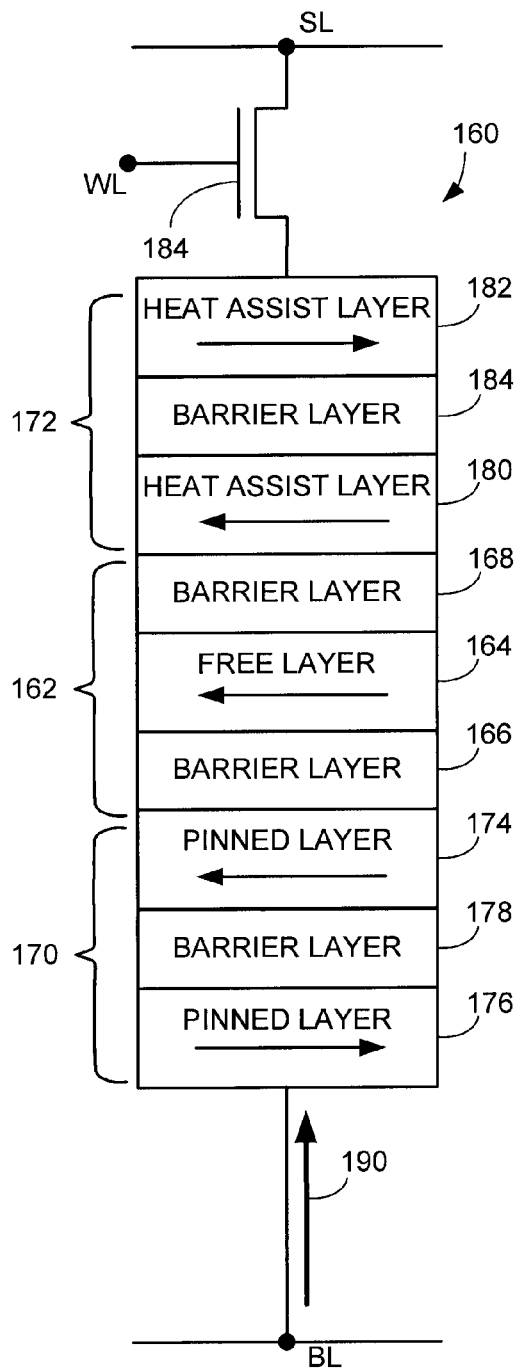
FIG. 8 generally illustrates an exemplary operation of a resistive sense element in accordance with various embodiments of the present invention.
Figure 9:
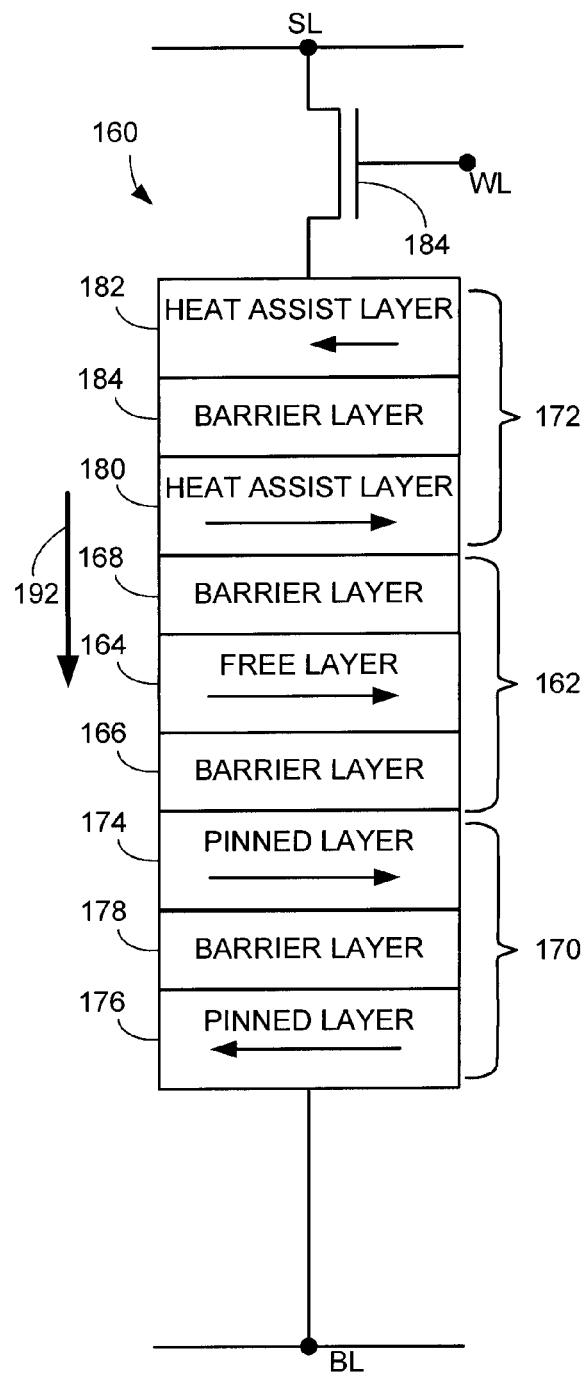
FIG. 9 provides an exemplary operation of a resistive sense element in accordance with various embodiments of the present invention.

Reference is now made to FIGS. 8 and 9, which provide an exemplary operation of the RSE 160 of FIG. 5. In FIG. 8, the RSE 160 is depicted as a variable resistor in series with the switching element (transistor) 184. The bit line is positioned adjacent the pinned region 170 while the switching device 184 and source line are adjacent the heat assist region 172. It should be noted that the heat assist region 172 is shown at a first temperature to which a zero net magnetic moment is produced.

As a write current 190 flows from the bit lined to the pinned region 170, the RSE 160 has a zero net magnetic moment due the balanced magnetic moments of both the pinned and heat assist regions 170 and 172. In some embodiments, the write current 190 is spin polarized as it passes through the RSE 160 to set the magnetic orientation of the free layer 164 of the magnetic tunneling junction 162 to a first polarity. The set plurality has an associated resistance for the RSE 160 that corresponds to a predetermined logical state. After the write current 190 has passed through the RSE 160, switching device 184, and source line the RSE 160 experiences a general magnetic moment from the free layer 164 because the magnetic moments of the heat assist region 172 and pinned region 170 remain balanced with respect to magnetic moment.

In order to write a second logical state to the RSE 160, FIG. 9 depicts a static magnetic field 192 generation and function. When it is desired to write a second logical state to the RSE 160, the heat assist region 172 is heated to a second temperature in which one of the heat assist layers 180 or 182 has a modified magnetic moment. The lack of balancing magnetic moments in the heat assist region 172 produces a non-zero net magnetic moment and a static magnetic field strong enough to switch the polarity of the free layer 164 of the magnetic tunneling junction 162 to the second logical state.

It should be noted that the pinned region 170 remains balanced with a zero net magnetic moment during the generation and utilization of the static magnetic field 192. The zero net magnetic moment of the pinned region 170 allows the static field to change the magnetic polarity of the free layer 164 with less intensity than would be required if a magnetic moment of the pinned region 170 would need to be compensated.

Consequently, the net zero magnetic moment of the various regions of the RSE 160 allows improved reliability, performance, and power consumption. The use of a single uni-polar and uni-directional write current greatly reduces the complexity often required to compensate for write current asymmetry. Meanwhile, the use of a static magnetic field provides precision and low power consumption that cannot be realized with bi-directional write currents.

It should further be noted that the manner in which the heat assist region 172 reaches a second temperature is not limited. That is, various components or procedures can be utilized to elevate the temperature of the heat assist region 172 and generate a static magnetic field. Furthermore, the elevation of temperature of the heat assist region 172 does not require the passing of a current through the entire RSE 160. For example, the heat assist region 172 can be heated independent of the magnetic tunneling junction 162 and pinned region 170. Thus, control and manipulation of the heat assist region 172 can be facilitated in various manners that generate a non-zero net magnetic moment and an associated static magnetic field.

It can be appreciated that using a bi-directional write current to write a logical state to a resistive sense element has numerous disadvantages such as high power consumption, reduced reliability, and complex write current asymmetry compensation circuitry. Indeed, the use of bi-directional write current provides more disadvantages than advantages considering the imprecision and inconsistency of passing write current through a resistive sense element in opposing directions.

Accordingly, various embodiments of the present invention generally operate to provide a precise and reliable resistive sense element that has specific regions that have a substantially zero net magnetic moment during a uni-polar and uni-directional write current, but have a non-zero net magnetic moment when a static magnetic field is used to write a logical state to the resistive sense element. The use of a static magnetic field instead of a write current passing through the resistive sense element in the opposing direction provides greater performance while reducing power consumption.

Figure 10:
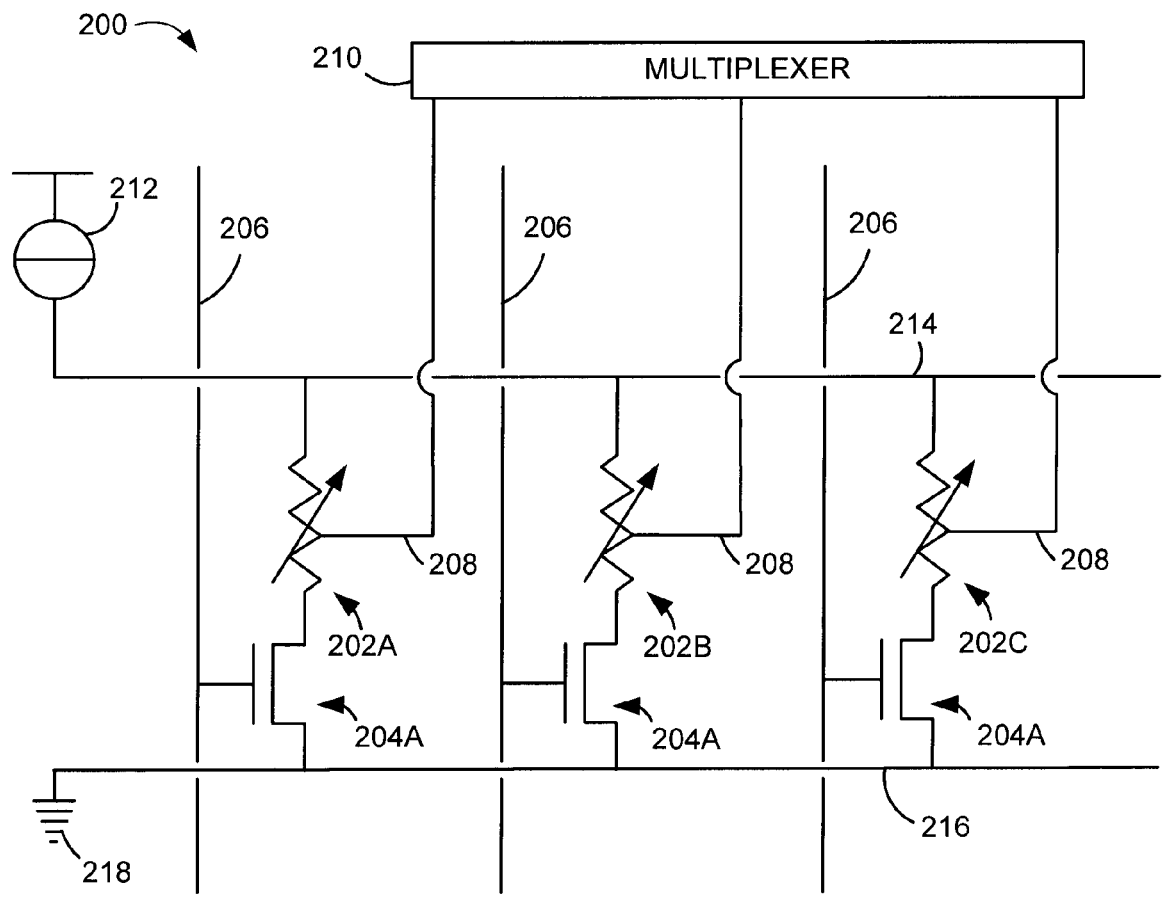
FIG. 10 displays an exemplary array of resistive sense elements constructed and operation in accordance with various embodiments of the present invention.

An exemplary embodiment is set forth by FIG. 10 to explain the foregoing features and advantages. FIG. 10 illustrates an array 200 of resistive sense elements as set forth by FIGS. 5-9 arranged into a semiconductor array. More specifically, FIG. 10 illustrates three STRAM cells denoted 202A-202C, each having an associated switching device (transistor) 204A-C. The switching devices are each connected and controlled by word lines 206 that are capable of selecting a particular one, or many, resistive sense elements, as desired.

It will be appreciated that the array can be extended to have any numbers of columns and rows of such cells, so the simplified 2×2 array in FIG. 7 is merely for purposes of illustration and is not limiting. The various directions of the word, bit and source lines across the array are also merely exemplary and can be oriented as desired. Each of the resistive sense elements 202A-C also is connected to a heat assist line 208 that is coupled to a multiplexer 210. The heat assist lines 208 allow the heat assist region of the resistive sense element to be heated from a first temperature to a second temperature without having to pass a current through the entire resistive sense element.

However, the configuration of the heat assist lines 208 is not limiting as one heat assist line 208 could be connected to any number of resistive sense elements. Likewise, the number and orientation of the multiplexer 210 is not limited to the configuration shown in FIG. 10. For example, a multiplexer 210 could be implemented for each row or column of resistive sense elements.

During operation, the array 200 can provide voltages to each, or all, of the resistive sense elements 202A-C from a driver 212. The driver 212 produces voltages that travel, in some embodiments, through the bit line 214 to a predetermined number of resistive sense elements 202A-C that have been selected by having the word line 206 operate a gate on each desired switching device 204A-C. After passing through the resistive sense element, voltage can pass through a source line 216 to a ground 218.

It should be noted that due to the static magnetic field writing capability of the resistive sense elements 202A-C, a second voltage driver capable of passing current through the resistive sense elements in the opposing direction (from source line to bit line) is not needed. However, the configuration of the driver 212 being positioned on the bit line 214 is not limiting as the position of the driver 212 and ground 218 can be inverted without deterring from the spirit of the present invention.

Figure 11:
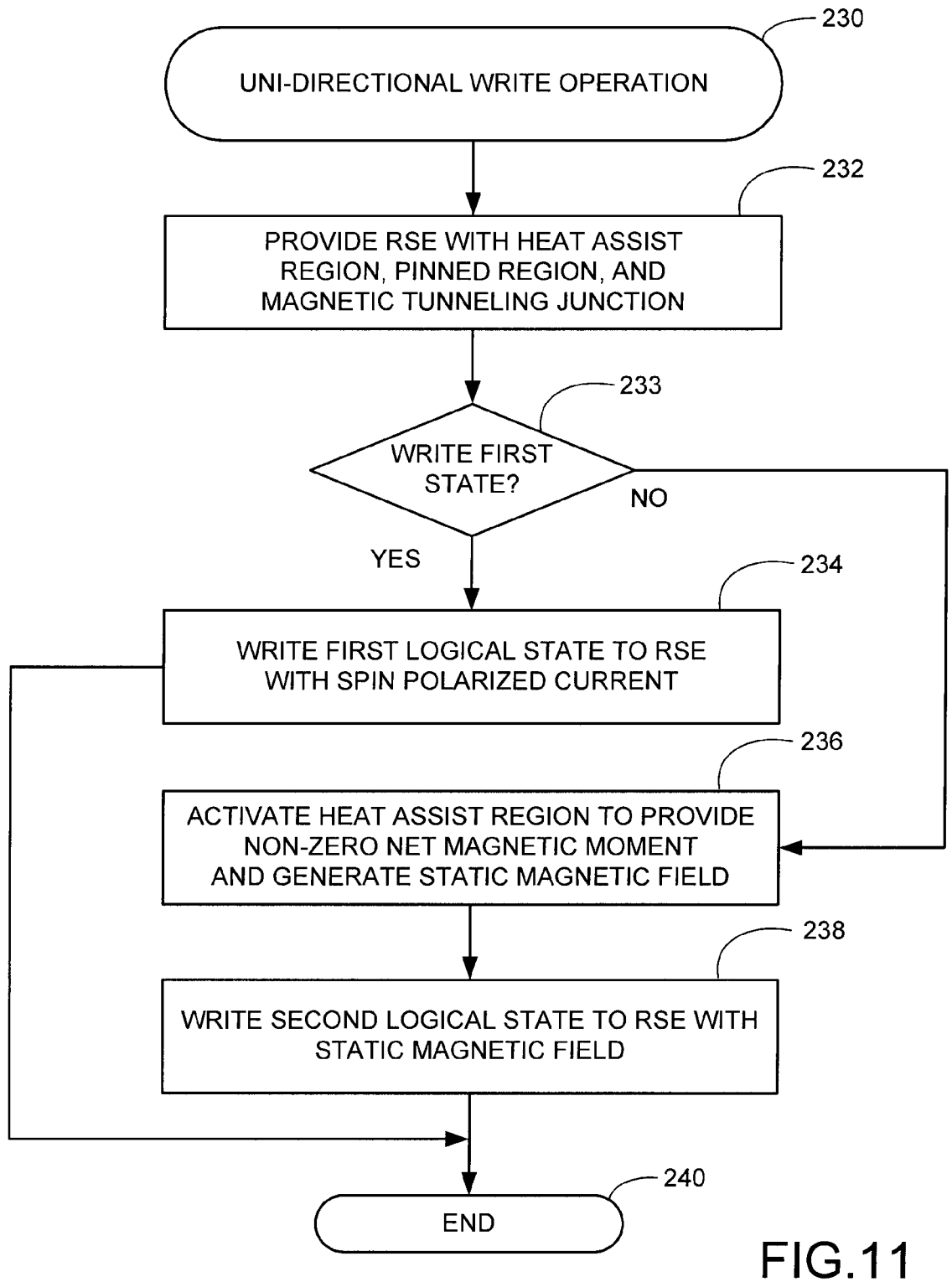
FIG. 11 is a flow chart for uni-polar write operation generally illustrative of steps carried out in accordance with various embodiments of the present invention.

FIG. 11 provides a flow chart for an uni-directional write operation 230, generally illustrative of steps carried out in accordance with various embodiments of the present invention. At step 232, a resistive sense element (RSE) is provided that has at least a heat assist region, pinned region, and magnetic tunneling junction. A first logical state is written to the RSE at step 234 with a spin polarized current. In some embodiments, the heat assist region is at a first temperature to which a substantially zero net magnetic moment is produced. Likewise, the pinned region is characterized during step 234 as having a zero net magnetic moment.

Subsequently, the heat assist region of the RSE is activated at step 236 to provide a non-zero net magnetic moment and generate a static magnetic field. In step 238, the static magnetic field migrates to the magnetic tunneling junction of the RSE to write a second logical state to the RSE. The routine then ends at step 240.

The various steps of the uni-directional write operation 230 are not limiting as steps can be omitted or repeated any number of times. That is, a first logical state could be written to an RSE repeatedly without ever writing a second logical state, or vice versa.

Although various embodiments set forth above generally identify the hard and easy directions based on the relative sequential ordering of a resistive sense element and a switching device of a cell, such is not necessarily limiting. Rather, it is contemplated that various memory cell constructions may alternatively have an "easy" and a "hard" direction based on some other feature of the cell. It will be understood that the various embodiments disclosed herein are equally suitable for these other types of memory cells in obtaining read current symmetry without compromising cell reliability.

As can be appreciated by one skilled in the art, the various embodiments illustrated herein provide advantageous writing of data to a resistive sense element in a fast and reliable manner. The ability to write various resistance states with a single uni-directional write current allows for consistent data writing without elevated power consumption. The use of a static magnetic field to write a logical state to a resistive sense element vastly improves the efficiency and complexity of any electronic data storage device. Moreover, the dynamic nature of the static magnetic field write provides increased performance with respect to write current driving ability. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A semiconductor stack comprising a heat assist region with a first magnetization along a first axis separated from a pinned region by a magnetically free layer disposed between first and second barrier layers, the pinned region and magnetically free layer respectively having second and third magnetizations each aligned along a second axis and perpendicular to the first axis.

2. The semiconductor stack of claim 1, wherein the heat assist region comprises to multiple different magnetization magnitudes and a net magnetic moment at a first predetermined temperature.

3. The semiconductor stack of claim 2, wherein the net magnetic moment corresponds with the magnetically free layer having a first logical state.

4. The semiconductor stack of claim 2, wherein the net magnetic moment is not present at a second predetermined temperature.

5. The semiconductor stack of claim 2, wherein the net magnetic moment corresponds to an amount of heat applied to the heat assist region.

6. The semiconductor stack of claim 1, wherein the heat assist region comprises a plurality of ferri-magnetic layers separated by a first barrier layer.

7. The semiconductor stack of claim 6, wherein the ferri-magnetic layers are synthetic.

8. The semiconductor stack of claim 6, wherein a first ferri-magnetic layer has a lower Curie temperature than a second ferri-magnetic layer.

9. The semiconductor stack of claim 1, wherein the heat assist region has an out-of-plane anisotropy in relation to the MTJ and pinned regions.

10. The semiconductor stack of claim 1, wherein the heat assisted region comprises a single ferri-magnetic layer comprising a rare earth transition metal.

11. A non-volatile memory comprising a plurality of resistive sense element (RSE) each having a heat assist region with a first magnetization along a first axis separated from a pinned region by a magnetically free layer disposed between first and second barrier layers, the pinned region and magnetically free layer respectively having second and third magnetizations each aligned along a second axis and perpendicular to the first axis.

12. The non -volatile memory of claim 11, wherein the plurality of RSE are connected in rows and columns respectively defined by at least one bit line rows, at least one source line, and at least one word line.

13. The non -volatile memory of claim 12, wherein the heat assist region of each RSE is connected to a common heat assist line.

14. The non-volatile memory of claim 13, wherein the heat assist lines are connected to and controlled by a multiplexer, the bit line is connected to and controlled by a first driver, the source line is connected to and controlled by a second driver, and the word line is connected to and controlled by a third driver.

15. The non -volatile memory of claim 12, wherein each RSE is coupled to a separate heat assist line.

16. A method comprising:
providing a heat assist region with a first magnetization along a first axis separated from a pinned region by a magnetically free layer disposed between first and second barrier layers, the pinned region and magnetically free layer respectively having second and third magnetizations each aligned along a second axis and perpendicular to the first axis;
writing a first logical state to the MTJ with a programming current through the RSE; and
writing a second logical state to the MTJ with a static magnetic field from the heat assist region.

17. The method of claim 16, wherein the pinned region has a zero net magnetic moment and the heat assist region is activated to produce a non-zero net magnetic moment that produces the static magnetic field.

18. The method of claim 16, wherein the heat assist region has a substantially zero net magnetic moment at a first temperature and a non-zero net magnetic moment at a second temperature.

19. The method of claim 16, wherein any logical state programmed to the RSE is uni-directional and uni-polar.

20. The method of claim 16, wherein the net magnetic moment of the heat assist region is orthogonal to the magnetically free layer.

* * * * *

UNITED STATES PATENT AND TRADEMARK OFFICE
CERTIFICATE OF CORRECTION

PATENT NO. : 8,466,524 B2  
APPLICATION NO. : 13/040155  
DATED : June 18, 2013  
INVENTOR(S) : Yuankai Zheng et al.

Page 1 of 1

It is certified that error appears in the above-identified patent and that said Letters Patent is hereby corrected as shown below:

In the Claims:

In Col. 8, line 48
delete "to".

Signed and Sealed this
Thirteenth Day of August, 2013

Teresa Stanek Rea
*Acting Director of the United States Patent and Trademark Office*